United States Patent
Chang et al.

(10) Patent No.: US 10,566,062 B2
(45) Date of Patent: Feb. 18, 2020

(54) MEMORY DEVICE AND METHOD FOR OPERATING THE SAME

(71) Applicant: MACRONIX INTERNATIONAL CO., LTD., Hsinchu (TW)

(72) Inventors: Kuen-Long Chang, Taipei (TW); Ken-Hui Chen, Hsinchu (TW); Shang-Chi Yang, Changhua County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/841,598

(22) Filed: Dec. 14, 2017

(65) Prior Publication Data

US 2019/0189222 A1   Jun. 20, 2019

(51) Int. Cl.
| | |
|---|---|
| *G11C 7/10* | (2006.01) |
| *G11C 16/26* | (2006.01) |
| *G11C 7/06* | (2006.01) |
| *G06F 12/02* | (2006.01) |
| *G06F 13/40* | (2006.01) |
| *G06F 13/16* | (2006.01) |

(Continued)

(52) U.S. Cl.
CPC ........... *G11C 16/26* (2013.01); *G06F 3/0659* (2013.01); *G06F 12/0246* (2013.01); *G06F 13/1673* (2013.01); *G06F 13/4004* (2013.01); *G11C 7/06* (2013.01); *G11C 7/106* (2013.01); *G11C 7/1078* (2013.01); *G11C 7/22* (2013.01); *G11C 11/4093* (2013.01); *G11C 16/22* (2013.01); *G11C 7/24* (2013.01); *G11C 16/0483* (2013.01); *G11C 2207/2245* (2013.01)

(58) Field of Classification Search
USPC ................................... 365/189.05
See application file for complete search history.

(56) References Cited

U.S. PATENT DOCUMENTS 7,352,630 B2 * 4/2008 Lee .................... G11C 16/3454
                                             365/185.22
7,397,717 B2   7/2008 Chen et al.
(Continued)

FOREIGN PATENT DOCUMENTS

TW         I582775 B    5/2017

OTHER PUBLICATIONS

TIPO Office Action dated Jan. 11, 2018 in Taiwan application (No. 106143910).

*Primary Examiner* — Hoai V Ho
*Assistant Examiner* — Minh Dinh
(74) *Attorney, Agent, or Firm* — McClure, Qualey & Rodack, LLP

(57) ABSTRACT

A memory device is disclosed in the present invention, comprising a memory array, a logic circuit, a sense amplifier circuit and a read buffer. The logic circuit is configured to perform a read operation in response to a read command and a start address. During the read operation, the logic circuit finds a target data in the memory array. The sense amplifier circuit is configured to read the target data from the memory array during the read operation. The read buffer is configured to temporarily stores and outputs the target data during the read operation. When an interruption event occurs during the read operation, the read buffer preserves a buffer content of the read buffer, and the logic circuit records a read status.

6 Claims, 3 Drawing Sheets

(51) Int. Cl.
*G06F 3/06* (2006.01)
*G11C 11/4093* (2006.01)
*G11C 16/22* (2006.01)
*G11C 7/22* (2006.01)
*G11C 16/04* (2006.01)
*G11C 7/24* (2006.01)

(56) References Cited

U.S. PATENT DOCUMENTS

| | | |
|---|---|---|
| 7,613,049 B2 | 11/2009 | Hung et al. |
| 7,788,438 B2 | 8/2010 | Kuo et al. |
| 7,908,443 B2 | 3/2011 | Hillier, III et al. |
| 8,064,268 B2 | 11/2011 | Hung et al. |
| 8,135,896 B2 | 3/2012 | Kuo et al. |
| 8,223,562 B2 | 7/2012 | Hung et al. |
| 8,320,066 B2 | 11/2012 | Yamakawa |
| 8,341,324 B2 | 12/2012 | Kuo et al. |
| 8,341,330 B2 | 12/2012 | Hung et al. |
| 8,630,128 B2 | 1/2014 | Hung et al. |
| 8,677,100 B2 | 3/2014 | Kuo et al. |
| 8,738,849 B2 | 5/2014 | Hung et al. |
| 8,850,103 B2 | 9/2014 | Bennett |
| 8,898,415 B2 | 11/2014 | Gillingham |
| 8,898,439 B2 | 11/2014 | Chang et al. |
| 9,075,925 B2 | 7/2015 | Kuo et al. |
| 9,152,585 B2 | 10/2015 | Ware |
| 9,378,790 B2 | 6/2016 | Farrell et al. |
| 10,101,933 B2 * | 10/2018 | Eguchi .................. G06F 3/0625 |
| 2008/0080283 A1 * | 4/2008 | Bergmann .......... G06F 12/0802 365/219 |
| 2015/0161004 A1 * | 6/2015 | Camp ................. G06F 11/1076 714/6.24 |

\* cited by examiner

MEMORY DEVICE AND METHOD FOR OPERATING THE SAME

BACKGROUND OF THE INVENTION

Field of the Invention

The invention relates to a memory device and method for operating the same.

Description of the Related Art

With the advent of the computer age, computer systems are widely used in a wide variety of electronic products (such as personal computers, mobile phones, etc.). In general, the computer system is composed of hardware and software. Memory is one of the important components of the hardware components.

Memory can be used to store data and read when needed. Existing memory in the process of reading a data, if for some reason was forced to interrupt (e.g., received other commands with higher priority than the read command), may cause the reading invalid. Part of the data that has been read may be discarded. In other words, if the memory is interrupted during a read operation, it takes additional time to perform the read operation from the very beginning.

In view of the problems stated above, how to provide a memory device and method for operating the same has become one of the important issues.

SUMMARY OF THE INVENTION

An embodiment of the present invention discloses a memory device comprising a memory array, a logic circuit, a sense amplifier circuit and a read buffer. The logic circuit is configured to perform a read operation in response to a read command and a start address. During the read operation, the logic circuit finds a target data in the memory array. The sense amplifier circuit is configured to read the target data from the memory array during the read operation. The read buffer is configured to temporarily stores and outputs the target data during the read operation. When an interruption event occurs during the read operation, the read buffer preserves a buffer content of the read buffer, and the logic circuit records a read status.

An embodiment of the present invention discloses a method for operating memory device comprising following steps: receiving a read command and a start address; and performing a read operation in response to the read command. The read operation comprises following steps: finding a target data according to the start address; reading the target data and temporarily storing the target data to a read buffer; and outputting the target data. When an interruption event occurs during the read operation, preserves a buffer content of the read buffer, and records a read status.

According to the memory device and method for operating the same disclosed in the embodiments of the present invention, it is possible to reduce the time required for continuing to read the target data after the read operation for reading the target data is interrupted, thereby improving the overall efficiency of the memory device.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
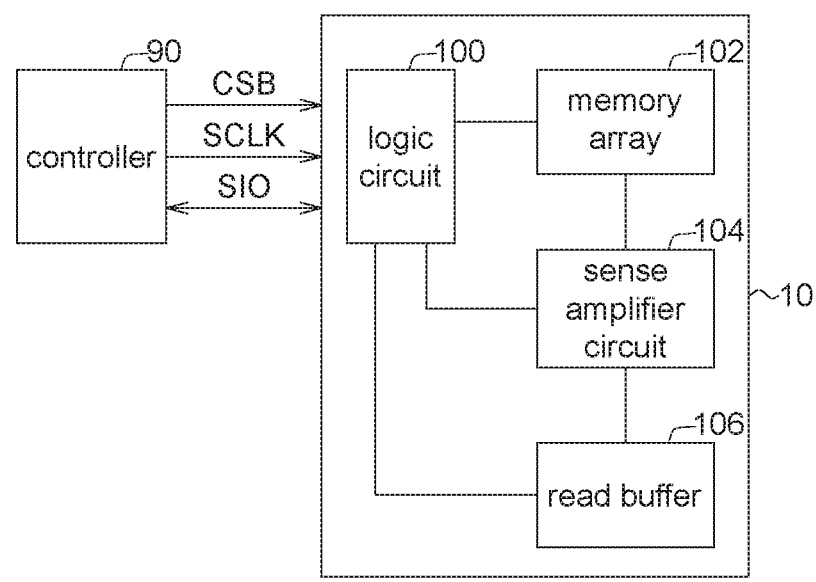
FIG. 1 shows a block diagram illustrating a memory device according to an embodiment of the present invention.

Referring to FIG. 1, FIG. 1 shows a block diagram illustrating a memory device according to an embodiment of the present invention. The memory device 10 is coupled to a controller 90, and is controlled by the controller 90. In the embodiment, the transmission interface between the memory device 10 and the controller 90 may be, for example, serial peripheral interface (SPI), and the invention is not limited by. The memory device 10 may be coupled to the controller through at least three signal buses CSB, SCLK, SIO.

The controller 90 selects or not selects the memory device 10 through the signal bus CSB. When the controller 90 selects the memory device 10, the memory device 10 is in an operable state; on the contrary, when the controller 90 not selects the memory device 10, the memory device 10 is in an inoperable state. When the controller 90 selects the memory device 10, the controller 90 may transmits a clock signal to the memory device 10 through the signal bus SCLK to control operation timings of the memory device 10. The controller 90 transmits write commands, read commands, erase commands, and the like to the memory device 10 through the signal bus 510. When the memory device 10 receives a command from the controller 90, the memory device 10 may execute corresponding operation according to the type of the command. Additionally, the controller 90 and the memory device 10 may be able to transmit data to each other through the signal bus SIO. For example, during a write operation, the controller 90 transmits data to be written to the memory device 10 through the signal bus SIO; during a read operation, the memory device 10 transmits data to be read to controller 90 through the signal bus SIO.

The memory device 10 includes a logic circuit 100, a memory array 102, a sense amplifier circuit 104 and a read buffer 106.

The logic circuit 100 is configured to receive commands from the controller 90, and operates the memory array 102, sense amplifier circuit 104 and the read buffer 106 according to the type of the commands.

The memory array 102 is coupled to the logic circuit 100. The memory array 102 may be non-volatile memory (NVM), e.g., NOR gate flash memory array, NAND gate flash memory array, and so on. The memory array 102 includes a number of memory cells which may be configured in 2D or 3D.

The sense amplifier circuit 104 is coupled to the logic circuit 100 and the memory array 102. The sense amplifier circuit 104 may be configured to sense data stored in the memory array 102, and read data from the memory array 102. After the sense amplifier circuit 104 read a data, the data may be temporarily stored into the read buffer 106.

The read buffer 106 is coupled to the logic circuit 100 and the sense amplifier circuit 104. The read buffer 106 may be configured to temporarily store the data read by the sense amplifier circuit 104 and to output the data to the controller 90.

Figure 2:
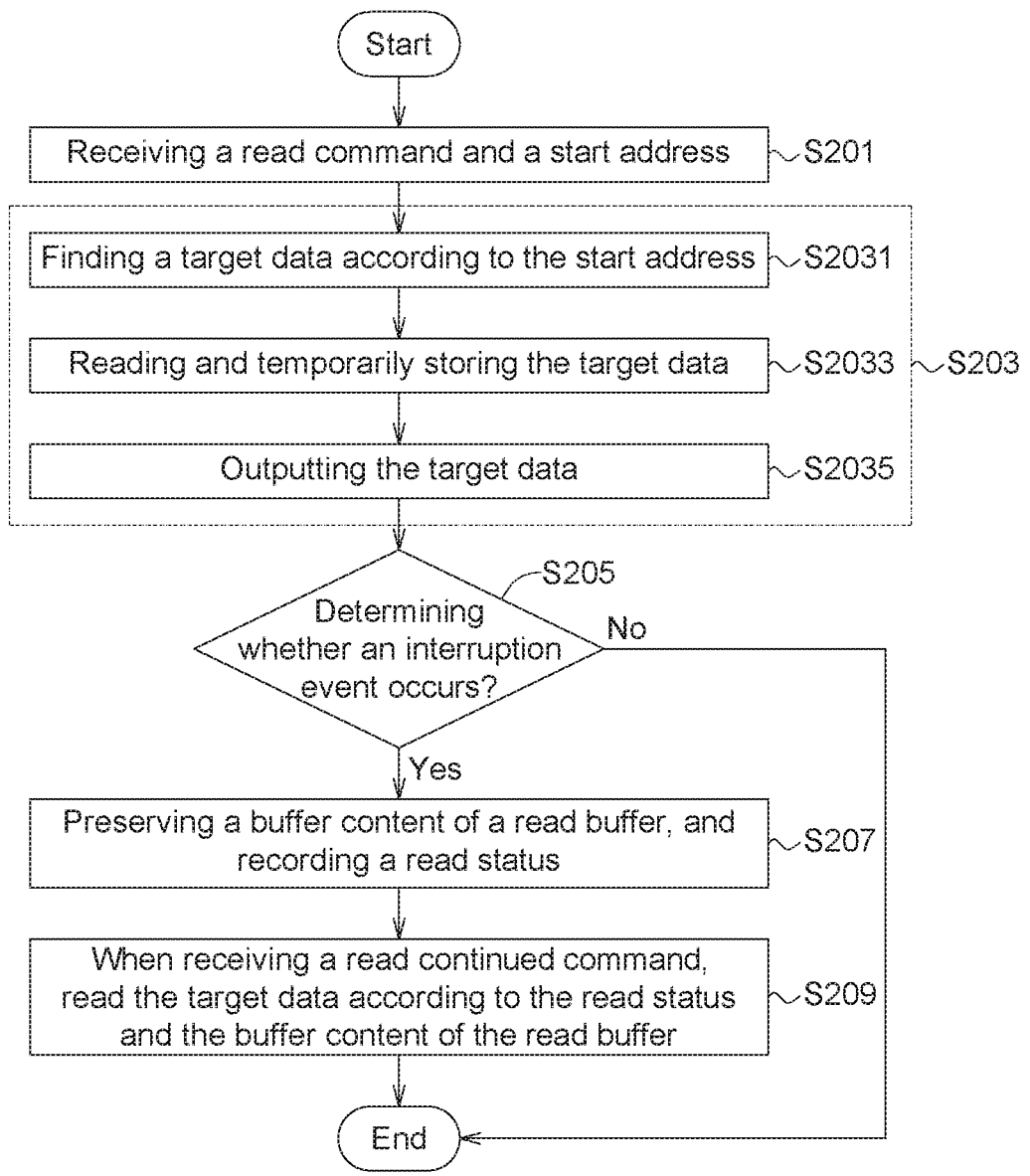
FIG. 2 shows a flow chart illustrating method for operating a memory device according to an embodiment of the present invention.

Referring to FIG. 2, FIG. 2 shows a flow chart illustrating a method for operating a memory device according to an embodiment of the present invention. The method for operating memory device includes steps S201~S209, and may be used to operate the memory device 10.

In step S201, receiving a read command and a start address is performed. The read command and the start address are produced by the controller 90, and are transmitted to the memory device 10 through the signal bus SIO.

In step S203, in response to the read command, executing a read operation is performed. In detail, step S203 may include steps S2031~S2035.

In step S2031, according to the start address, finding a target address is performed. Generally, the start address represents memory address of a memory cell in the memory device 10 which stores the first bit of the data sequence of the target data. When the logic circuit 100 receives the read command and the start address from the controller 90, the start address may be stored in an address buffer (not shown). Then, according to the start address, the logic circuit 100 may find the memory cells storing target data in the memory array 102.

In step S2033, reading and temporarily storing the target data is performed. In detail, when the position storing the target data is found, the logic circuit 100 may indicates the sense amplifier circuit 104 to read the target data. Then, the target data read by the sense amplifier circuit 104 may be temporarily stored in the read buffer 106.

In step S2035, outputting the target data is performed. In detail, when the target data is stored in the read buffer 106, the read buffer 106 may successively outputs the target data to the controller through the signal bus SIO.

For example, it is assumed that the target data is a data having 32 bits; when reading the target data from the memory array 102, the sense amplifier circuit 104 reads 8 bits each clock cycle; length of the read buffer 106 is 32 bits; the signal bus 510 may transmit 8 bits each clock cycle. In this example, the sense amplifier circuit 104 reads 8 bits of the target data (start from the start address) each clock cycle from the memory array 102, and temporarily stores the 8 bits to the read buffer 106. The sense amplifier circuit 104 may take four clock cycles to completely read the target data from the memory array 102. After part of the target data (e.g., 8 bits) has been stored in the read buffer 106, the read buffer 106 may start to output the 8 bits of the target data each clock cycle to the controller 90 through the signal bus SIO. The read buffer 106 may take four clock cycles to completely output the target data to the controller 90. In other words, step S2033 and S2035 may be repeated a number of times until the target data is completely outputted to the controller 90 (i.e., the read operation is completed).

In step S205, determining whether an interruption event occurs is performed. The interruption event refers to an event that causes the read operation (step S203) to be interrupted before completion. For example, the memory device 10 receives a command having a higher priority than the read command (e.g., a write command) before the read operation is completed. The interruption event occurs, for example, during a period performing step S2033 or during a period performing step S2035. When the interruption event occurs, step S207 is performed; when the interruption event does not occur, the process is ended (i.e., the read operation is not interrupted and successfully completed).

In step S207, preserving a buffer content of the read buffer, and recording a read status is performed. Buffer content refers to data which is temporarily stored in the read buffer 106 (e.g., part of the target data or all of the target data). The read status may be recorded by the logic circuit 100, and may be used to record an execution status of the read operation when the interruption event occurs. The read status includes, for example, the timing that the interruption event occurs, the number of bits that the target data has been read (by the sense amplifier circuit 104) and temporarily stored (in the read buffer 106) or the number of bits that the target data has been outputted from the read buffer 106 to the controller 90. However, regardless of the timing at which the interruption event occurs e.g., during the period that step S2033 is performed or during the period that step S2035 is performed), the buffer content of the read buffer 106 may be preserved (i.e., the buffer content may not be cleared).

In step S209, when receiving a read continued command, reading the target data according to the read status and the buffer content of the read buffer is performed. Step S209 may include two embodiments, and the details may be described below.

In first embodiment of step S209, it is assumed that when the interruption event occurs, part of the target data has been read by the sense amplifier circuit 104 and temporarily stored to the read buffer 106. After step S207 has been performed, the buffer content of the read buffer 106 (i.e., part of the target data that has been temporarily stored and has not been outputted yet) may be preserved. When the logic circuit 100 receives the read continued command, the logic circuit 100 may indicate the sense amplifier circuit 104 to read the rest part of the target data from the memory array 102 according to the read status. For example, it is assumed that the sense amplifier circuit 104 has read 16 bits of the target data (having 32 bits in total) and temporarily stored in the read buffer 106 when the interruption event occurs. After step S207 is performed, the part of the target data which has been temporarily stored in the read buffer 106 and has not been outputted yet (e.g., 8 bits) may be preserved, and the read status may be recorded by the logic circuit 100. When step S209 is performed, the logic circuit 100 indicates the sense amplifier circuit 104 to read the rest 16 bits of the target data according to the read status. When the rest part of the target data is read, it is possible to start reading from the unread part of the target data in the memory array 102, or from a start bit selecting from the part of the target data which has been read.

In second embodiment of step S209, it is assumed that when the interruption event occurs, all of the target data has been read by the sense amplifier circuit 104 and temporarily stored to the read buffer 106. The read buffer 106 may have not yet begun to output the target data to the controller 90, or the read buffer 106 has outputted part of the target data to the controller 90. When the logic circuit 100 receives the read continued command, the logic circuit 100 may indicate the read buffer 106 to output the target data or to output the rest part of the target data to the controller 90 according to the read status. For example, it is assumed that the read buffer 106 has outputted 16 bits of the target data (having 32 bits in total) to the controller 90 when the interruption event occurs. After step S207 is performed, the part of the target data which is still temporarily stored in the read buffer 106 (16 bits) may be preserved, and the read status may be recorded by the logic circuit 100. When step S209 is performed, the logic circuit 100 indicates the read buffer 106 to output the rest 16 bits of the target data to the controller 90 according to the read status. When the rest part of the target data is outputted, it is possible to start outputting from the part of the target data which has not been outputted yet, or from a start bit selecting from the part of the target data which has been outputted.

Figure 3:
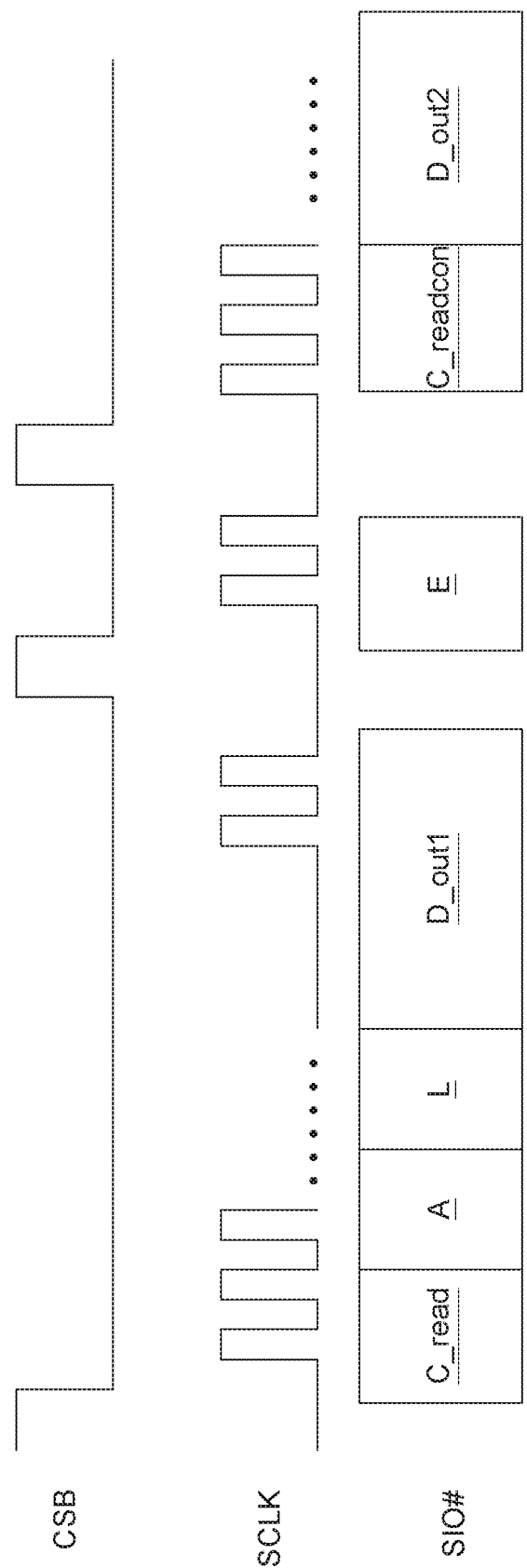
FIG. 3 shows a timing diagram of a memory device according to an embodiment of the present invention.

The timing diagram of the second embodiment is shown in FIG. 3. As shown in FIG. 3, after the memory device 10 receives the read command C_read and the start address A, it needs to take a latency L to read part of the target data and to temporarily store the target data to the read buffer 106. Then, data outputting D_out1 represents that the read buffer 106 outputs the target data to the controller 90 (the sense amplifier circuit 104 may successively read the target data which has not been read at the same time). When the interruption event E occurs, part of the target data has not been outputted to controller 90 yet. After the interruption event E is ended, the memory device 10 receives the read continued command C_readcon from the controller 90. Since it is no need to wait for the sense amplifier circuit 104 to read the target data from the memory array 102, no delay (or a short delay) occurs when reading is continued. The read buffer 106 outputs the rest of the target data to the controller 90 during the data outputting D_out2.

In conclusion, when the interruption event occurs during the read operation, by preserving the buffer content of the read buffer 106 and recording the read status, the memory device 10 may continue to read the target data according to the read status and the buffer content in response to the read continued command. That is, the memory device 10 may continue to finish the read operation interrupted by the interruption event in response to the read continued command, rather than starting a new read operation for reading the same target data. According to the memory device and the method for operating the same disclosed in the embodiments of the present invention, it is possible to reduce the time required for continuing to read the target data after the read operation for reading the target data is interrupted, thereby improving the overall efficiency of the memory device.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a memory array;
   a logic circuit, configured to perform a read operation in response to a read command and a start address, during the read operation, the logic circuit finding a target data in the memory array;
   a sense amplifier circuit, configured to read the target data from the memory array during the read operation; and
   a read buffer, configured to temporarily store and output the target data during the read operation,
   wherein when an interruption event occurs during the read operation, the read buffer preserves a buffer content of the read buffer, and the logic circuit records a read status,
   wherein the interruption event is an event that the memory device receives a command having a higher priority than the read command, and
   wherein when receiving a read continued command, the logic circuit continues to read the target data according to the read status and the buffer content, when the interruption event occurs, part of the target data has been read by the sense amplifier circuit and has been temporarily stored to the read buffer, the logic circuit indicates the sense amplifier circuit read the rest part of the target data according to the read status and the buffer content in response to the read continued command.

2. The memory device according to claim 1, wherein when the interruption event occurs, all of the target data has been read by the sense amplifier circuit and has been temporarily stored to the read buffer, the logic circuit indicates the read buffer to output the target data according to the read status and the buffer content in response to the read continued command.

3. The memory device according to claim 1, wherein when the interruption event occurs, all of the target data has been read by the sense amplifier circuit and has been temporarily stored to the read buffer, and part of the target data has been outputted, the logic circuit indicates the read buffer to output the rest part of the target data according to the read status and the buffer content in response to the read continued command.

4. A method for operating memory device, comprising:
   receiving a read command and a start address;
   performing a read operation in response to the read command, the read operation comprising:
      finding a target data according to the start address;
      reading the target data and temporarily storing the target data to a read buffer; and
      outputting the target data,
   wherein when an interruption event occurs during the read operation, preserves a buffer content of the read buffer, and records a read status,
   wherein the interruption event is an event that the memory device receives a command having a higher priority than the read command, and
   wherein when receiving a read continued command, the logic circuit continues to read the target data according to the read status and the buffer content, when the interruption event occurs, part of the target data has been read by the sense amplifier circuit and has been temporarily stored to the read buffer, the logic circuit indicates the sense amplifier circuit read the rest part of the target data according to the read status and the buffer content in response to the read continued command.

5. The method for operating memory device according to claim 4, wherein when the interruption event occurs, all of the target data has been read and has been temporarily stored to the read buffer, outputs the target data according to the read status and the buffer content in response to the read continued command.

6. The method for operating memory device according to claim 4, wherein when the interruption event occurs, all of the target data has been read and has been temporarily stored to the read buffer, and part of the target data has been outputted, outputs the rest part of the target data according to the read status and the buffer content in response to the read continued command.

* * * * *